United States Patent
Mout et al.

(10) Patent No.: US 11,892,769 B2
(45) Date of Patent: Feb. 6, 2024

(54) METHOD FOR DETECTING AN OBJECT STRUCTURE AND APPARATUS FOR CARRYING OUT THE METHOD

(71) Applicant: Carl Zeiss SMT GmbH, Oberkochen (DE)

(72) Inventors: Beat Marco Mout, Aalen (DE); Dirk Seidel, Jena-Leutra (DE); Christoph Husemann, Jena (DE); Ulrich Matejka, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 742 days.

(21) Appl. No.: 17/018,072

(22) Filed: Sep. 11, 2020

(65) Prior Publication Data
US 2021/0081693 A1 Mar. 18, 2021

(30) Foreign Application Priority Data
Sep. 12, 2019 (DE) .......................... 102019213904.3

(51) Int. Cl.
*G03F 1/84* (2012.01)
*G03F 7/00* (2006.01)

(52) U.S. Cl.
CPC .............. *G03F 1/84* (2013.01); *G03F 7/705* (2013.01); *G03F 7/70608* (2013.01)

(58) Field of Classification Search
CPC ........ G03F 1/84; G03F 7/705; G03F 7/70608; G03F 1/22; G01B 11/24; G01B 2210/56; G01B 11/14; G01N 21/84; G02B 27/42
See application file for complete search history.

(56) References Cited

U.S. PATENT DOCUMENTS 4,716,414 A * 12/1987 Luttrell .................. G01S 13/89
356/4.09
6,753,971 B1 6/2004 Hertling
(Continued)

FOREIGN PATENT DOCUMENTS

CN 101820817 A 9/2010
CN 104634542 A 5/2015
(Continued)

OTHER PUBLICATIONS

Third Office Action issued by the Korean Parent Office for Application No. 10-2020-0116830, dated Mar. 31, 2023 (with English Machine Translation).
(Continued)

*Primary Examiner* — Tung S Lau
(74) *Attorney, Agent, or Firm* — Fish & Richardson P.C.

(57) ABSTRACT

When detecting an object structure, at least one portion of the object is initially illuminated with illumination light of an at least partly coherent light source from at least one preferred illumination direction. At least one diffraction image of the illuminated portion is recorded by spatially resolved detection of the diffraction intensity of the illumination light, diffracted by the illuminated portion, in a detection plane. At least one portion of the object structure is reconstructed from the at least one recorded diffraction image using an iterative method. Here, the iteration diffraction image of a raw object structure is calculated starting from an iteration start value and said raw object structure is compared to the recorded diffraction image in each iteration step. The iteration start value is taken by starting from a raw object structure of the object structure to be detected, which is obtained by an iteration start value ascertainment method that is independent of the remaining detection method. This
(Continued)

yields a method in which a detection of an object structure is designed to be insensitive at a given accuracy.

23 Claims, 5 Drawing Sheets

(56) References Cited

U.S. PATENT DOCUMENTS

| | | | |
|---|---|---|---|
| 8,959,465 | B2 | 2/2015 | Nyhus et al. |
| 2008/0226157 | A1 | 9/2008 | Stokowski |
| 2010/0241396 | A1 | 9/2010 | Rodenburg |
| 2013/0258091 | A1* | 10/2013 | Ozcan .............. G06V 20/69 348/79 |
| 2017/0045823 | A1 | 2/2017 | Quintanilha |
| 2017/0131528 | A1 | 5/2017 | Ruoff et al. |
| 2017/0132782 | A1* | 5/2017 | Matejka ............ G02B 13/08 |
| 2018/0164229 | A1 | 6/2018 | Pisarenco et al. |
| 2021/0208536 | A1 | 7/2021 | Reichelt et al. |

FOREIGN PATENT DOCUMENTS

| | | |
|---|---|---|
| CN | 105806250 A | 7/2016 |
| CN | 106575088 A | 4/2017 |
| CN | 107924119 A | 4/2018 |
| CN | 108303037 A | 7/2018 |
| CN | 108885425 A | 11/2018 |
| CN | 109035359 A | 12/2018 |
| DE | 19950559 A1 | 5/2001 |
| KR | 1020140103977 | 8/2014 |
| TW | 201833684 A | 9/2018 |
| TW | 201901291 A | 1/2019 |
| TW | 201931021 A | 8/2019 |
| WO | WO 2004/008069 | 1/2004 |
| WO | WO 2006/076484 | 7/2006 |
| WO | WO 2016/012426 | 1/2016 |
| WO | WO 2018/212787 | 11/2018 |
| WO | WO 2019/086221 | 5/2019 |

OTHER PUBLICATIONS

Office Action issued by the Chinese Patent Office for Application No. CN 202010957859.7, dated Dec. 27, 2021 (with English Machine Translation).

First Office Action issued by the Korean Parent Office for Application No. 10-2020-0116830, dated Feb. 24, 2022 (with English Machine Translation).

Second Office Action issued by the Korean Parent Office for Application No. 10-2020-0116830, dated Aug. 31, 2022 (with English Machine Translation).

Office Action and Search Report issued by the Taiwan Patent Office for Application No. TW 109131149, dated Feb. 10, 2022 (with English Translation).

Bunk et al., "Influence of the overlap parameter on the convergence of the ptychographical iterative engine", *Ultramicroscopy*, vol. 108, Issue 5, pp. 481-487 (2008).

German Examination Report for German Application No. DE 10 2019 213 904.3, dated Jul. 28, 2020 (with English Translation).

Faulkner, H.M.L. et al., "Movable Aperture Lensless Transmission Microscopy: A Novel Phase Retrieval Algorithm", *Physical Review Letters*, vol. 93, No. 2, pp. 023903-1-023903-4 (Jul. 2004).

Gardner, D. et al., "High numerical aperture reflection mode coherent diffraction microscopy using off-axis aperture illumination", *Optics Express*, vol. 20, No. 17, pp. 19050-19059 (Aug. 13, 2012).

Harada, T. et al., "Phase Imaging of Extreme-Ultraviolet Mask Using Coherent Extreme-Ultraviolet Scatterometry Microscope", *Japanese Journal of Applied Physics*, vol. 52, pp. 06GB02-1-06GB02-5 (2013).

Maiden, A. et al., "Further improvements to the ptychographical iterative engine", *Optica*, vol. 4, No. 7, pp. 736-745 (Jul. 2017).

Zhang, B. et al., "Full field tabletop EUV coherent diffractive imaging in a transmission geometry", *Optics Express*, vol. 21, No. 19, pp. 21970-21980 (Sep. 23, 2013).

* cited by examiner

METHOD FOR DETECTING AN OBJECT STRUCTURE AND APPARATUS FOR CARRYING OUT THE METHOD

CROSS-REFERENCE TO RELATED APPLICATION

The present application claims the priority of German patent application DE 10 2019 213 904.3, filed on Sep. 12, 2019, the content of which is incorporated herein by reference in its entirety.

TECHNICAL FIELD

The invention relates to a method for detecting an object structure. Further, the invention relates to an apparatus for carrying out the aforementioned method.

BACKGROUND

A method and respectively an apparatus for detecting a structure of a lithography mask are known from WO 2016/012426 A1. In the latter a 3D aerial image measurement takes place in the region around an image plane during the imaging of a lithography mask arranged in an object plane.

SUMMARY

Aspects of the present invention include a method and an apparatus for detecting an object structure, in particular a structure of a lithography mask, to be insensitive and/or robust at a given accuracy.

In respect of the method aspect of the invention, a method for detecting an object structure is provided. The method includes the following steps: illuminating at least one portion of an object with illumination light of an at least partly coherent light source from at least one preferred illumination direction, recording at least one diffraction image of the illuminated portion by spatially resolved detection of the diffraction intensity of the illumination light, diffracted by the illuminated portion, in a detection plane, and reconstructing at least one portion of the object structure from the at least one recorded diffraction image by way of an iterative method in which, starting from an iteration start value, an iteration diffraction image of a raw object structure is calculated and the latter is compared to the recorded diffraction image in each iteration step. The iteration start value is taken by starting from a raw object structure of the object structure to be detected, which is obtained by an iteration start value ascertainment method that is independent of the remaining detection method.

According to the invention, it was identified that an independently obtained raw object structure, starting from which an iteration start value is taken, can facilitate, improve or accelerate a convergence of the iterative reconstruction. The object whose structure should be detected by the method could be a lithography mask or a photomask. A structure of the lithography mask to be detected could be the mask structure itself, which is to be imaged during the projection exposure. The structure detection method then finds use for qualifying masks, for example in the style of a metrology system from WO 2016/012426 A1. As an alternative or in addition thereto, the structure to be detected could be a position marker on the lithography mask. The structure detection method can then find use in a registration tool which, for example, very accurately measures positions of structures on the lithography mask. In the method, the diffraction image can be implemented entirely without interposing an optical unit between the lithography mask and the detection plane. Alternatively, use can be made of an optical unit where the requirements placed thereon are regularly less demanding than the requirements placed on an imaging optical unit in an imaging structure detection method. The iterative method can be a ptychographic method. An object structure portion which is reconstructed using the raw object structure could be a structure portion which, for example, cannot be sufficiently illuminated. The detection method can also be used to reduce or eliminate an influence of insufficiently illuminated object structure portions, which has a negative effect on overall reconstruction of an object structure of interest. When carrying out the detection method, illuminating and recording can be implemented with the aid of known CDI (coherent diffraction imaging) techniques. The iteration start value ascertainment method, which is independent of the detection method, can for example make do without recording a diffraction image or can make do without at least sectional object illumination or can make do without a reconstruction step of the detection method.

The iteration start value can be generated with the aid of a simulation, with the aid of a measurement or else with the aid of a combination of a simulation and a measurement. The iteration start value can be generated by aerial image simulation of an object which is based on an object design. This aerial image simulation can use the same imaging parameters as the measurement, i.e., as the diffraction image recording, in particular. Information from the production process for the object structure can be used in the aerial image simulation. As an alternative or in addition thereto, the iteration start value can be generated with the aid of an object measurement, which is also referred to as a start measurement. The start measurement can be used directly or can be processed. The goal of such processing of a measurement result of the start measurement can be to match imaging parameters of the start measurement to imaging parameters of the diffraction image recording. The result of the start measurement can also be used as an input for a subsequent simulation. The start measurement can also be used as input variable for a neural network. Such a neural network can be trained to map start measurements to results of the diffraction image recording, in particular to CDI results. The start measurement can be generated with an optical method, with the aid of electron microscopy, with the aid of atomic force microscopy or with any other known method.

The detection method renders it possible to use algorithms, known from the literature, for reconstructing the object structure from at least one recorded diffraction image to arrive at a reconstruction result for the object structure by way of an iterative method, said reconstruction result having an accuracy or resolution that is better than a pixel resolution of the diffraction image detection. Using the detection method, a reconstruction quality can be increased to such an extent that it is possible to measure structure positions, structure heights or intensities and structure contrasts with a high accuracy. This is particularly advantageous within the scope of photomask inspection and/or photomask metrology.

In some examples, the iteration start value can be obtained by a simulation method. The result of the simulation method can be a simulated aerial image of an ideally designed object. Alternatively, the iteration start value can be obtained by an independent measuring method or else by a different independent ascertainment method. A modification of the raw object structure can also follow for the purposes of obtaining the iteration start value. Here, use can be made of, for example, a stepwise approximated version, e.g., a binary version, of an intermediate result.

In some examples, the simulation of object imaging is used when carrying out the simulation method. The simulation of object imaging has proven its worth for specifying an iteration start value.

In some examples, the object-imaging imaging parameters are used during the simulation, the object-imaging imaging parameters corresponding to those used during illumination and/or reconstruction. Using the imaging parameters can increase stability of the ascertainment method. As an alternative or in addition thereto, the imaging parameters can be derived from the measurement, i.e., from the diffraction image recording, in particular. By way of example, the wavelength of the light source for object illumination and an illumination-side and/or a detection-side numerical aperture, which is used during the illumination and/or the diffraction image recording, can thus be used during the simulation. The same imaging parameters can be used during, firstly, the reconstruction and, secondly, the recording of the diffraction image.

In some examples, the iteration start value is obtained proceeding from a measuring method. The measuring method facilitates a refined specification of the iteration start value. The measuring method can be an optical measuring method. Alternatively, the measuring method can be a non-optical method, for example a probing method or any other mechanical or non-mechanical measuring method. The iteration start value can also be obtained with the aid of electron microscopy, with the aid of atomic force microscopy or with any other known method. Techniques known from coordinate measuring machines can be used in the measuring method. A combination of a measuring procedure with, for example, a subsequent simulation can be used to obtain the iteration start value. Here, additional disturbance effects, such as disturbances in the optical imaging, can be simulated, for example.

In some examples, a simulation of an object production is included in the simulation method. Simulating the object production is practice-oriented. Here, a simulation of an etching and/or development process for specifying object edge rounding, for example, and a simulation of other structure-influencing etching and/or development effects can be implemented. As an alternative to simulation of the object production, knowledge about the object production can be included in the simulation method, for example the empirical judgement that certain edges of object structures are not sharp but rounded in practice.

In respect of the apparatus aspect, an apparatus for carrying out the method described above includes: a light source for providing the illumination light, a spatially resolving detector, arranged in the detection plane, for detecting a diffraction intensity when recording the diffraction image, and a mask holder which is displaceable for changing between the portions to be illuminated of the lithography mask. The advantages of an apparatus correspond to those which have already been explained above with reference to the structure detection method. The apparatus can be used as a measurement system for mask qualification or else as a registration tool.

A light source of the apparatus can ensure illumination from exactly one illumination direction. The light source can be embodied for example as arc lamp, laser (in particular excimer laser), synchrotron, HHG (High Harmonic Generation) or FEL (Free Electron Laser). Alternatively, other light sources in the EUV or in the UV wavelength range are also possible. The structure detection of the lithography mask can be implemented with an illumination light wavelength which corresponds to that which is likewise used during the lithographic projection exposure of the lithography mask for the production of semiconductor components. This is also referred to as actinic structure detection. However, this wavelength correspondence is not mandatory, and so the structure detection method can also be implemented with a different illumination light wavelength compared with the projection exposure. A pellicle can be applied on the lithography mask in order to protect the lithography mask. The apparatus can comprise an interferometric measurement device for measuring a position of the illuminated portion on the lithography mask. The apparatus can comprise a structure generator for generating a structure of a beam of the illumination light. Such a structure can be selected so as to optimize a distribution of an illumination intensity over the recorded illumination image in particular for utilizing a usable dynamic range of the spatially resolving detector.

BRIEF DESCRIPTION OF DRAWINGS

Exemplary embodiments of the invention are explained in greater detail below with reference to the drawings. In said drawings.

DETAILED DESCRIPTION

Figure 1:
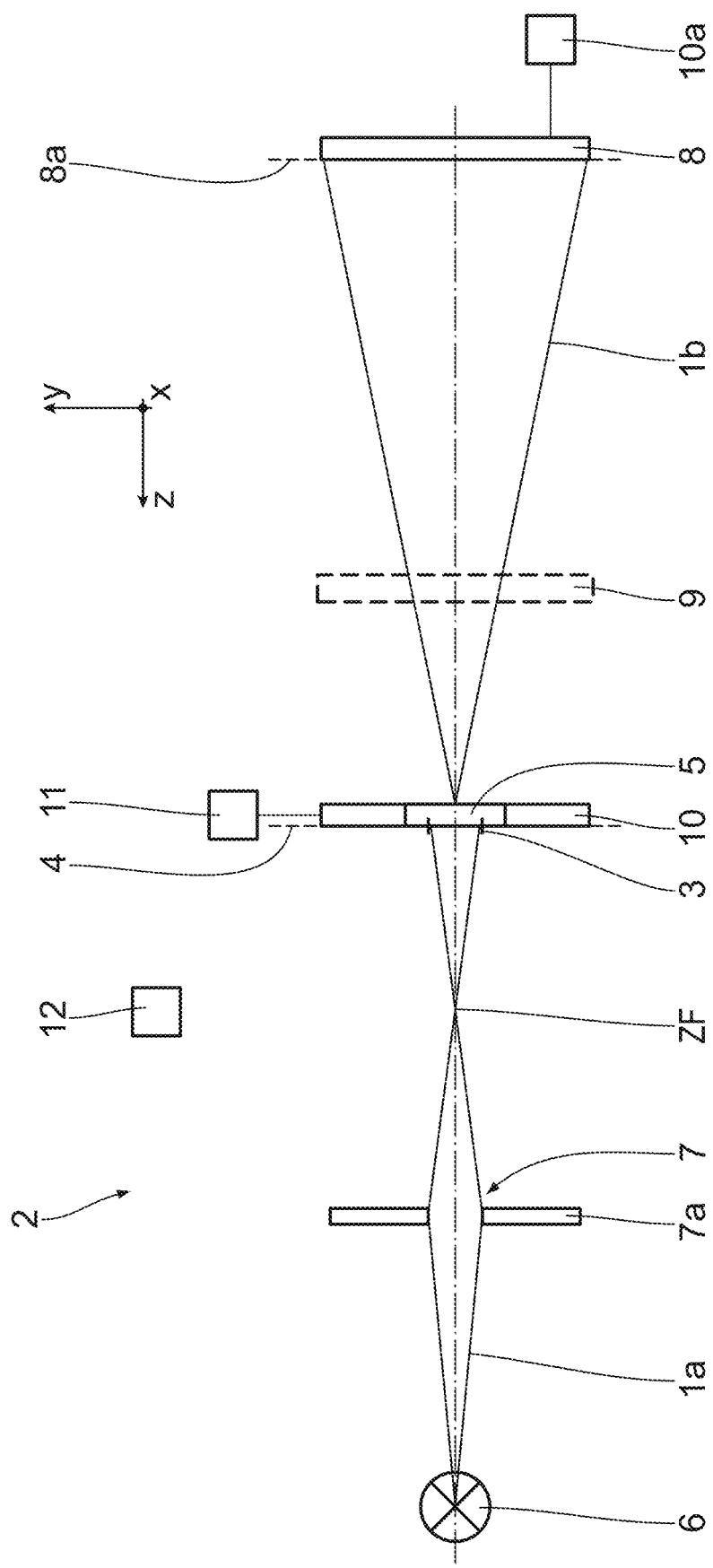
FIG. 1 shows highly schematically, in a plan view with the viewing direction perpendicular to a plane of incidence, a measurement system for detecting a structure of a lithography mask by detection of at least one diffraction pattern, for measuring a reflective lithography mask as object structure to be detected, the object with the object structure being measured in transmission.

FIG. 1 shows in a view corresponding to a meridional section a beam path of EUV illumination light or imaging light 1a, 1b (collectively referenced as 1) in a metrology system 2 for the examination or detection of an object 5, arranged in an object field 3 in an object plane 4, in the form of a reticle or a lithography mask with the EUV illumination light 1.

The metrology system 2 is used for analysis of a diffraction pattern and serves to detect an object structure, in particular a structure of the lithography mask, which is in turn used during EUV projection exposure for the production of semiconductor components. The mask structure detected by the metrology system 2 can then be used for example to determine effects of properties of the lithography mask on the optical imaging by projection optical units within a projection exposure apparatus.

The metrology system 2, in a similar manner to the system known from WO 2016/012426 A1, can be a system for mask qualification. In this case, the structure to be detected of the lithography mask 5 is the mask structure to be imaged itself.

As an alternative or in addition thereto, the structure to be detected of the lithography mask 5 can be a position marker or a used structure on the lithography mask 5. The detection of such a position marker or a used structure can be used to detect or to measure an exact position of a plurality of position markers with respect to one another or of a plurality of used structures with respect to one another or used structure(s) relative to position marker(s) on the lithography mask 5. This is one of the possible applications of the metrology system 2 as a registration tool. Alternatively, a registration tool could be used to measure used structures and determine the registration error thereof. One registration tool is known under the tradename PROVE®. The measurement wavelength of the illumination light 1 can correspond to an actual projection exposure wavelength.

In order to facilitate the presentation of positional relationships, a Cartesian xyz-coordinate system is used hereinafter. The x-axis extends perpendicular to the plane of the drawing and out of the latter in FIG. 1. The y-axis extends upward in FIG. 1. The z-axis extends to the left in FIG. 1.

The object plane 4 is parallel to the xy-plane.

The illumination light 1 is reflected and diffracted at the object 5. A plane of incidence of the illumination light 1 lies parallel to the yz-plane.

Depending on the embodiment of the metrology system 2, the latter can be used for a reflective or for a transmissive object 5. One example of a transmissive object is a phase mask.

The EUV illumination light 1 is generated by a light source 6. This can be a light source in the visible range, in the near, middle or far UV range or in the EUV range. The light source 6 can be a laser plasma source (LPP; laser produced plasma) or a discharge source (DPP; discharge produced plasma). It is also possible to use a synchrotron-based light source, or a Free Electron Laser (FEL). The light source 6 can comprise a device for generating high harmonics of a fundamental wavelength (High Harmonic Generation, HHG). A used wavelength of the EUV light source can be, e.g., in the range of between 5 nm and 30 nm. However, longer or shorter wavelengths are also possible. In principle, in the case of a variant of the metrology system 2, a light source for another used light wavelength can also be used instead of the light source 6, for example a light source for a UV or DUV used wavelength of 193 nm.

The light source 6 is an at least partly coherent light source.

An illumination optical unit 7, not illustrated in any more detail, of the metrology system 2 is arranged between the light source 6 and the object 5. The illumination optical unit 7, which is illustrated schematically in FIG. 1, includes a stop 7a. The illumination optical unit 7 serves for the illumination of the object 5 to be examined with a defined illumination intensity distribution over the object field 3 and at the same time with a defined illumination angle or a defined illumination angle distribution with which the field points of the object field 3 are illuminated. With the lithography mask 5 arranged in the object field 3, the object field 3 simultaneously constitutes an illuminated portion of the lithography mask 5.

Following transmission through the object 5 (variant of the metrology system 2 according to FIG. 1) or reflection at the object 5 (variant of the metrology system 2 according to FIG. 9), the diffracted illumination or imaging light 1 impinges on a spatially resolving detection unit or detection device 8 of the metrology system 2. The illumination light guided to the object 5 is denoted by 1a in FIG. 1 and the illumination light diffracted by the object 5 in transmission is denoted by 1b in FIG. 1.

Figure 9:
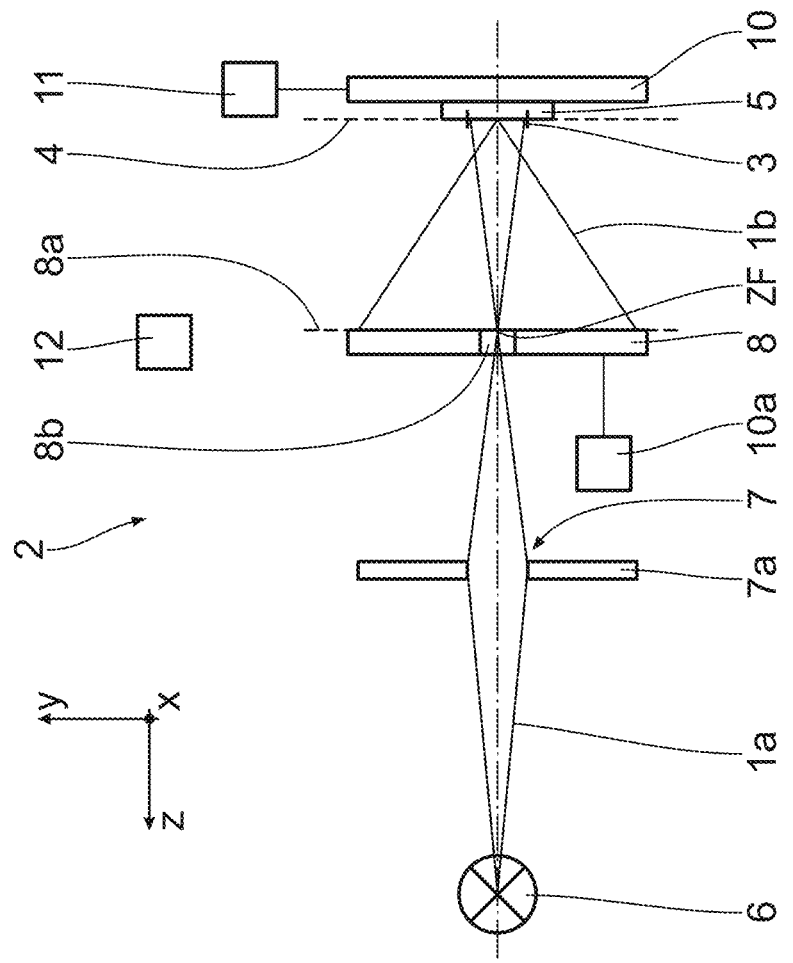
FIG. 9 shows, in an illustration similar to FIG. 1, an alternative measurement system, configured to measure the object in reflection.

An intermediate focus, denoted by ZF in FIGS. 1 and 9, can be located in the beam path of the illumination light between the stop 7a and the object field 3.

The detection device 8 is designed as a CCD or CMOS detector, for example. A spatial resolution of the sensor or detector arises by way of a corresponding pixel division. The spatially resolving detector of the detection device 8 can be delimited in a square or rectangular fashion. The CCD or CMOS detector is arranged in a detection plane 8a. The detection device 8 detects a diffraction intensity during the recording of the diffraction pattern of the lithography mask 5. As indicated in FIG. 1, a deflecting and/or beam-influencing optical unit 9 can be arranged between the object 5 and the detection device 8. This is not mandatory, however. In other words, it is also possible for no optical element and/or no beam-influencing element at all to be arranged between the object 5 and the detection device 8.

The detection device 8 is signal-connected to a digital image processing device 10a.

The object 5 is carried by a mask or object holder 10. The latter can be displaced by way of a displacement drive 11 on the one hand parallel to the xy-plane and on the other hand perpendicularly to this plane, that is to say in the z-direction, e.g. in Δz increments. The mask holder 10 is displaceable in the x- and/or y-direction for switching between portions of the lithography mask 5 to be illuminated. The mask holder 10 can additionally be embodied as tiltable about the x-axis and/or about the y-axis. The displacement drive 11, as also the entire operation of the metrology system 2, is controlled by a central control device 12, which, in a way that is not illustrated in more specific detail, is signal-connected to the components to be controlled.

The illumination light 1 impinges on the object field 3 with a chief ray angle CRA between an illumination-side chief ray and a normal to the object plane 4. The object field 3 arises as illumination spot of the illumination light 1.

A chief ray angle CRA in the range between 3° and 9° is possible, in particular. A smaller chief ray angle is also possible, for example a chief ray angle of 0° as shown in FIGS. 1 and 9. By way of example, an angle of incidence CRA of 0° can be achieved by way of a partly transmissive mirror, in particular. Proceeding from the object field 3, the zero order of diffraction of the illumination light 1 propagates with an image-side chief ray angle between an image-side chief ray and the normal, which in turn has the value of the incidence-side chief ray angle CRA.

On the image side, the detection device 8 has a detection angle between the two outer marginal rays that are spaced furthest apart from one another. To the extent that none of the rays of the illumination light 1 are incident on the object field 3 in perpendicular fashion, a detection angle arises between an inner marginal ray closest to the normal and an outer marginal ray, which has the greatest distance from the normal.

A distinction should be made between the various illumination situations in which at least one portion of the object 5 is illuminated in each case with the illumination light 1 from at least one preferred illumination direction. By way of example, the object field 3 can be illuminated with exactly one defined illumination angle, for example exactly along the object-side chief ray CRAO. In this case, there is an illumination intensity only in the center of an illumination pupil, i.e., in a distribution of illumination angles of the illumination light 1 over the object field 3, at the intersection point of the object-side chief ray. Alternatively, the object field 3 could be illuminated with a distribution of various illumination angles present within the illumination pupil. These various illumination angles can be used simultaneously or sequentially for the purposes of illuminating the object field 3.

The illumination pupil and a detection pupil, i.e., a detection angle range of the illumination light 1 diffracted by the object field 3, are each delimited in circular fashion and have the same diameter. Alternatively, the boundary of the illumination pupil and/or of the detection pupil can deviate from a circular form and could be elliptical, for example. A major axis of the ellipse can extend along the x-direction or else along the y-direction. The illumination pupil and the detection pupil can have different dimensions.

A numerical aperture of the detection of the illumination light diffracted by the object field 3, which arises from the detection pupil, is 0.0825.

This detection-side numerical aperture can range between 0.05 and 0.8, depending on the embodiment of the detection device 8, in particular as a result of using the interposed optical unit 9. The detection-side numerical aperture can range between 0.0625 and 0.21 for EUV illumination wavelengths and can also be greater when using DUV wavelengths and can even be greater than 0.8.

Figure 2:
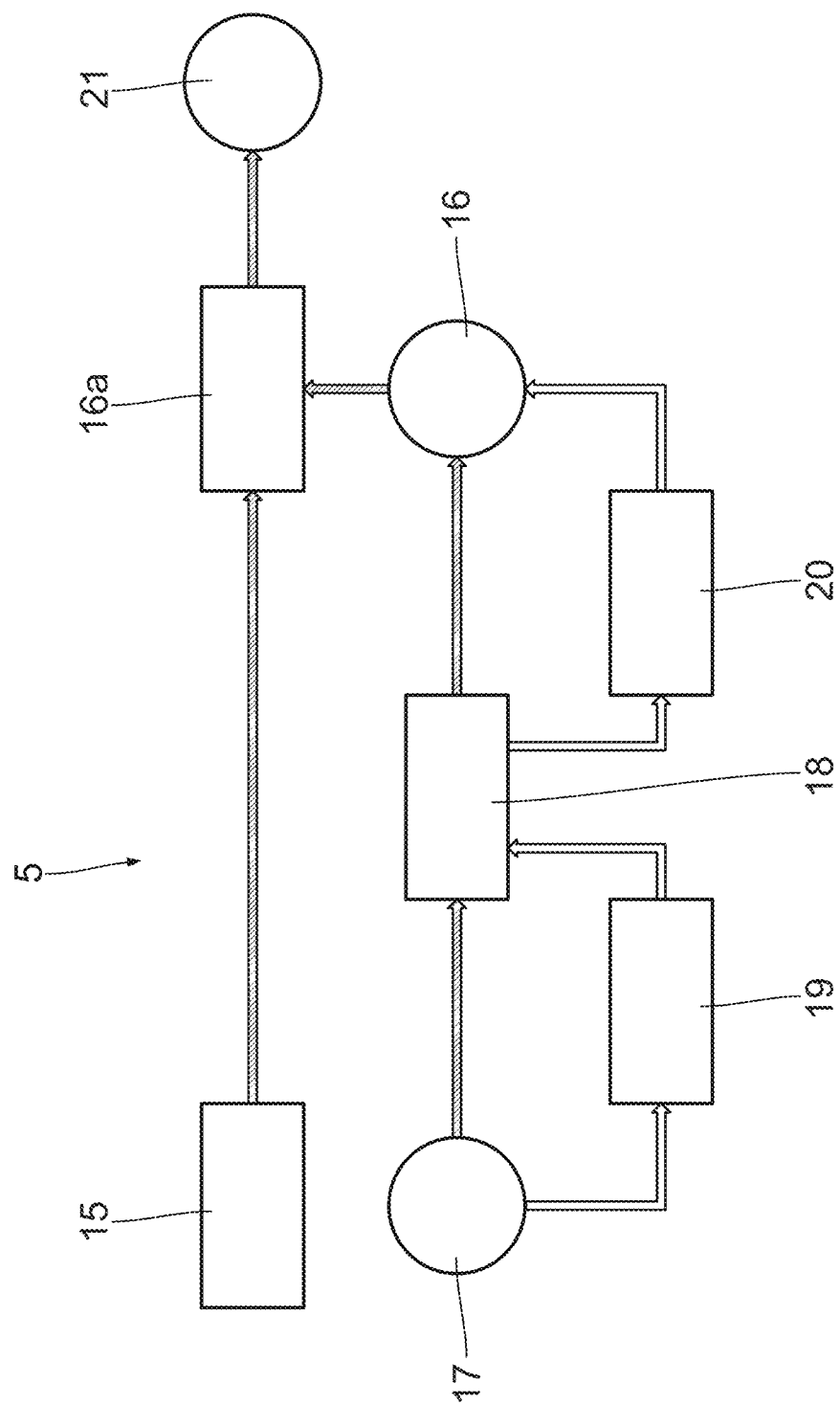
FIG. 2 shows a schematic flow chart of a method for detecting the object structure using an iteration start value starting from the raw object structure of the object structure to be detected, which is obtained by a raw object structure ascertainment method, for example a simulation method, which is independent of the remaining detection method, with optional method steps being represented by unfilled arrows.

A method for detecting a structure of the lithography mask 5 is described on the basis of FIG. 2. FIG. 2 shows the fundamental steps when working through an iterative Fourier transform algorithm (IFTA).

In a first step 15, a portion of the lithography mask 5, namely the portion coinciding with the object field 3, is illuminated with the illumination light 1 of the light source 6 with a defined illumination direction or a defined illumination direction distribution, as described above. The illumination 15 can be implemented in the form of a ptychographic measurement.

With the aid of the detection device 8, a diffraction pattern of the illuminated portion is recorded by spatially resolved detection of a diffraction intensity of the illumination light 1 diffracted by the illuminated portion of the lithography mask 5 in the detection plane 8*a*.

In particular, far field imaging can be implemented with the aid of the optical unit 9. In order to represent the diffraction pattern, the optical unit 9 can thus generate an image of the imaging pupil. The optical unit 9 can be embodied as at least one Bertrand lens element or at least one Bertrand mirror. However, the optical unit can also simply be omitted and the far field imaging can be realized by means of a certain distance between the illuminated lithography mask and the sensor.

The illumination of the lithography mask 5 is then carried out for further portions of the lithography mask 5. For this purpose, the lithography mask 5 is displaced relative to the illumination spot of the illumination light 1 in the xy-plane, which is implemented with the aid of the mask holder 10. This therefore results in a corresponding relative displacement of the object field 3 on the lithography mask 5. Adjacent illuminated portions on the lithography mask 5 overlap in each case in an overlap region. An area extent of said overlap region amounts to at least 5% of the smaller of the two illuminated portions of the lithography mask 5. If the illuminated portions, as in the case of the exemplary embodiment described, are each of the same size and have the extent of the object field 3, the overlap region amounts to at least 5% of the area of the object field 3. In variants of the structure detection method, the overlap region can amount to at least 10%, at least 20%, at least 30%, at least 40%, at least 50%, at least 60%, at least 70%, at least 80% or else at least 90% of the area of the object field 3.

A reconstruction 16*a* of the structure of the lithography mask 5 from the recorded diffraction patterns is implemented by means of an iterative method. To this end, an approximation for the structure of the lithography mask in the form of an iteration start value 16 is initially used. This iteration start value 16 emerges starting from the raw object structure 17 of the structure of the object 5 to be detected. The iteration start value 16 is obtained from the raw object structure 17 with the aid of a simulation method, for example with the aid of an aerial image simulation 18. This could be a simulated aerial image of an object with an ideal design in respect of its structure. Alternatively, the iteration start value can also be obtained from the raw object structure by an independent ascertainment or measuring method. A modification of the raw object structure 17 for the purpose of obtaining the aerial image simulation 18 is also possible. Such an optional modification step is illustrated at 19 in FIG. 2. A modification of the aerial image as a result of the aerial image simulation 18 is also possible. Such an aerial image modification step is illustrated at 20 in FIG. 2. Object production aspects can be included in the aerial image simulation 18 and/or the modification steps 19, 20, for example a simulation of an etching and/or development process for specifying object edge rounding or other structure-influencing etching and/or development effects. A combination of the measuring procedure and a subsequent simulation for obtaining the iteration start value 16 is also possible, for example a simulation with additional disturbance effects, for example within the scope of object imaging.

A specified rasterization or stepwise representation of an intermediate result is also possible, for example for generating a binary variant of an iteration start value. Thus, the aerial image modification step 20 can be implemented in the form of a binarization of the intensity.

Within the scope of the aerial image simulation 18, it is possible to use imaging parameters that correspond to those that are used when illuminating 15 and/or, optionally, when reconstructing 16*a*.

In the reconstruction 16*a*, the iteration start value 16 is illuminated in one portion and the diffraction image is calculated with the aid of a simulation. In this case, the simulation of the illumination corresponds to the illumination actually carried out previously. In a simple case, the diffraction pattern can be calculated by means of a Fourier transform of the approximation illuminated portion by portion. The calculated diffraction pattern consists of amplitude and phase information. The amplitude is replaced by the root of the measured diffraction pattern (of the same illuminated portion of the lithography mask) and the phase is maintained. A new estimation of the structure of the lithography mask is obtained by means of an inverse Fourier transform (or reverse simulation).

This estimation extends over an area of the lithography mask 5, wherein only a portion or a portion structure of this estimation corresponds to the illuminated portion or the illuminated portion structure. It is only in this region that the initially assumed approximation for the structure of the lithography mask is updated by the newly obtained estimation in terms of amplitude and phase. This newly obtained estimation is then illuminated in a different portion and the procedure just described is repeated, with the result that gradually all measured diffraction patterns contribute to an overall approximation 21 of the structure of the lithography mask. It is usually necessary for each illuminated portion to undergo the described procedure a number of times in an iterative method, since the overall estimation of the structure of the lithography mask still changes and the simulated diffraction patterns thus still change in terms of amplitude and phase. This is repeated until the overall approximation 21, i.e., the region to be detected of the lithography mask 5, converges, i.e., does not change by more than a predefined tolerance value. The structure of the lithography mask 5 thus resulting from the converging overall approximation 21 is the result of the detection method.

In the method described, the phase cannot be directly corrected by a measurement, but rather is set to the correct value only gradually.

The overall approximation 21 consists of value pairs "Amplitude/Phase" for all calculated portion structures at the respective spatial coordinates x, y which are assigned to the lithography mask 5. In this case, the amplitude value corresponds to the square root of the intensity of the light in the band-limited near field of the lithography mask. In this case, the phase value corresponds to the phase of the light in the band-limited near field of the lithography mask 5. These values yield structure information of the lithography mask 5.

The calculation of the object structure of the respective portion and the combination to form the overall approximation 21 are implemented using a method of coherent diffractive imaging (CDI). Such a method is known from the specialist article "High numerical aperture reflection mode coherent diffraction microscopy using off-axis apertured illumination" by D. F. Gardner et al., Optics Express, Vol. 20, No. 17, 2012.

Basic principles of the iterative Fourier transform algorithm (IFTA) are found in the specialist article "Further improvements to the ptychographical iterative engine" by A. Maiden et al., OPTICA, Vol. 4, No. 7, 2017 and "Movable Aperture Lensless Transmission Microscopy: A Novel Phase Retrieval Algorithm" by H. M. L. Faulkner et al., PhysRevLett., Vol. 93, No. 2, 2004.

A further reference for the use of a diffractive image recording in structure detection is the specialist article "Full field tabletop EUV coherent diffractive imaging in a transmission geometry" by B. Zhang et al., Optics Express, Vol. 21, No. 19, 2013.

The reconstruction 16a can be a ptychographic reconstruction.

Figure 3:
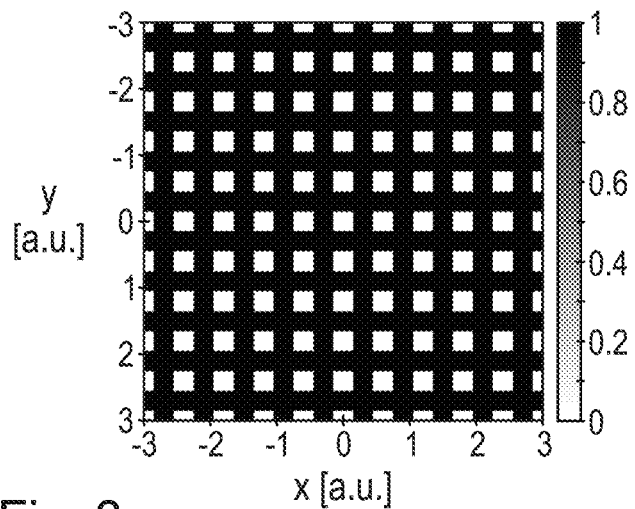
FIG. 3 is an amplitude representation of an exemplary iteration start value, plotted in two dimensions x and y, wherein the scale for elucidating the respective amplitude value is reproduced on the right, the iteration start value being used starting from a mesh-shaped raw object structure.

FIG. 3 shows, in exemplary fashion, an iteration start value 16 in the form of a regular mesh, wherein an amplitude is 1 along the rows and columns of the mesh and 0 in the region of the mesh fields delimited thereby. A distance between adjacent lines or columns is less than 1 μm.

An object field 3 is illuminated with an area of 1.5 μm×1.5 μm.

Figure 4:
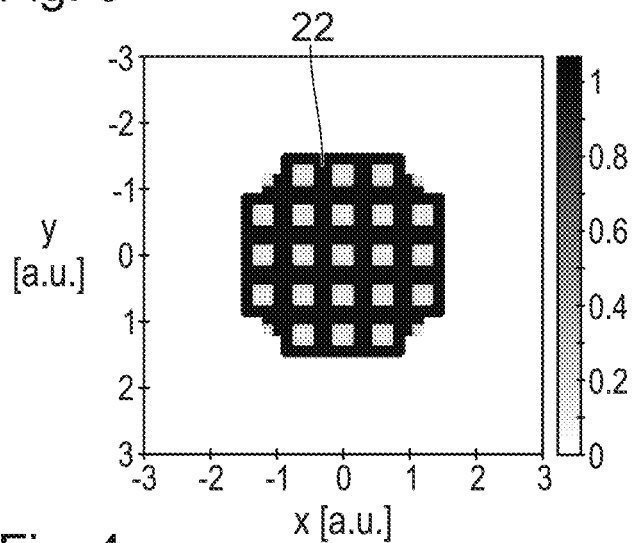
FIG. 4 shows, in an illustration similar to FIG. 3, an amplitude of a portion of the object structure reconstructed using the detection method, starting from the iteration start value according to FIG. 3.

FIG. 4 shows amplitude values of a reconstructed portion structure 22 as intermediate step of the reconstruction 16a.

Figure 5:
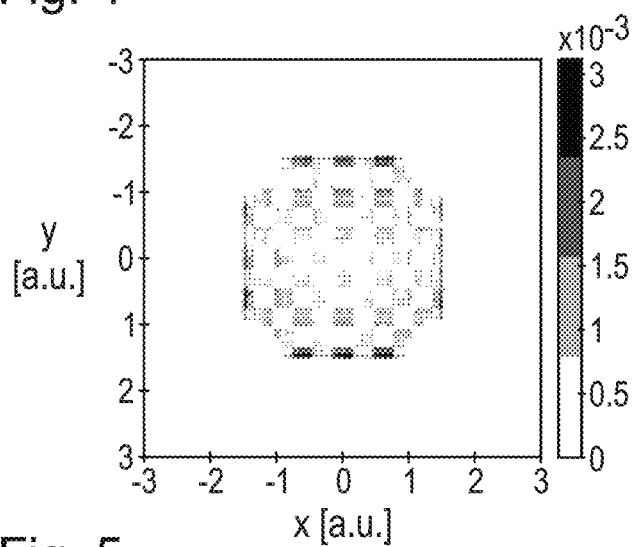
FIG. 5 shows, in an illustration similar to FIG. 3, an intensity error as a difference between the intensity of the reconstructed object structure portion according to FIG. 4 and the actual intensity of the object structure in the reconstructed portion.

FIG. 5 shows an intensity error in the reconstruction 16a as a difference between the reconstructed image 21 and an actual image representation of the object structure. This intensity error lies in the range of +1-1% of the maximum illumination intensity. Looking over the reconstructed portion structure 22, this intensity error is less than $3 \times 10^{-3}$ virtually everywhere and predominantly even smaller than $1 \times 10^{-3}$.

The x-/y-scalings of FIGS. 3 to 5 are true to scale with respect to one another.

The iteration start value 16 emerging from the raw object structure can facilitate, improve or accelerate a convergence during the iteration of the reconstruction 16a. The portion structure 22 and/or 23 which is reconstructed using the raw object structure 17 could be a structure portion which, for example, cannot be sufficiently illuminated.

FIGS. 6 to 8 once again show an iteration start value (FIG. 6), a reconstructed portion structure 23 (FIG. 7) and an intensity error of the reconstruction (FIG. 8), in the case of different start values than in FIGS. 3 to 5.

Figure 6:
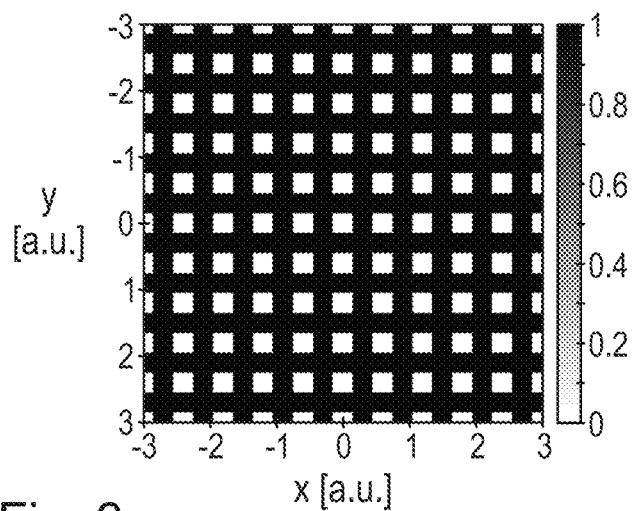
FIGS. 6 to 8 show, in illustrations similar to FIGS. 3 to 5, an iteration start value (FIG. 6), a reconstructed object portion (FIG. 7) and an intensity error (FIG. 8), wherein different boundary conditions are used in the detection method, in particular an increase of an area of the reconstructed object structure portion.
Figure 7:
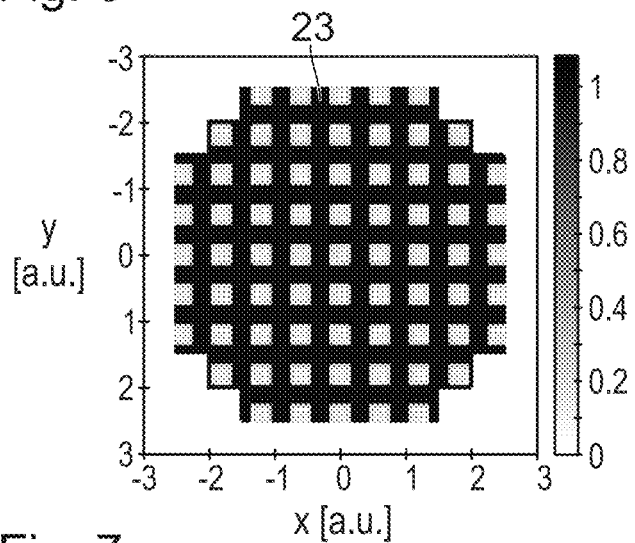
Figure 8:
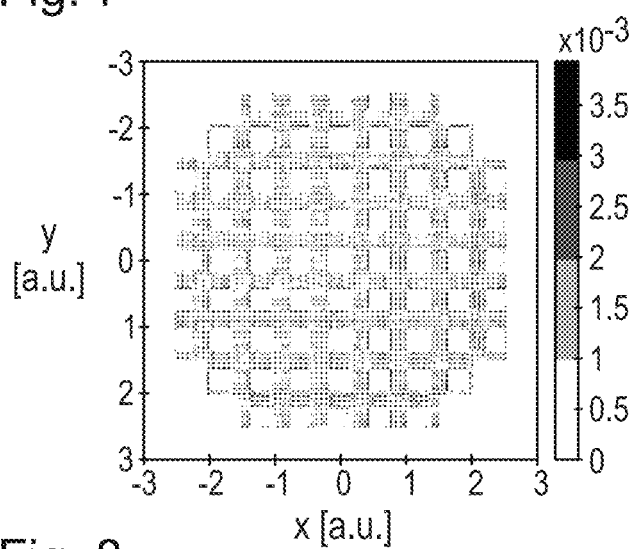

In contrast to FIGS. 3 to 5, the stop 7a has a different setting in FIGS. 6 to 8. Here, an object field 3 is illuminated with an extent of 2.5 μm×2.5 μm.

In terms of its diameter in the x-/y-plane, the reconstructed portion structure 23 according to FIG. 7 is greater than the reconstructed portion structure 22 according to FIG. 4.

What emerges is that the reconstruction is significantly improved and a reconstruction error can be reduced to values in the region of $10^{-3}$, i.e., 0.1% or less.

In contrast to FIG. 1, FIG. 9 shows the metrology system 2, designed for measuring the object 5 in reflection. Components and functions corresponding to those which have already been explained above with reference to FIGS. 1 to 8, and particularly with reference to FIG. 1, bear the same reference signs and will not be discussed in detail again.

In this case, the detection device 8 has a passage opening 8b for the passage of the illumination light 1, and so a perpendicular illumination of the object 5 is also possible here. The intermediate focus ZF can be located in the region of the passage opening 8b.

The illumination light guided to the object 5 is denoted by 1a in FIG. 9 and the illumination light reflected and diffracted by the object is denoted by 1b in FIG. 9. A central shadowing of the diffraction image excluded on account of the passage opening 8b in the detection device 8 can be reconstructed within the scope of the object structure detection method.

In some implementations, the digital image processing device 10a (FIGS. 1, 9) can include one or more data processors for processing data, one or more storage devices for storing data, such as one or more databases, and/or one or more computer programs including instructions that when executed by the digital image processing device causes the digital image processing device to carry out the processes. The digital image processing device can include one or more input devices, such as a keyboard, a mouse, a touchpad, and/or a voice command input module, and one or more output devices, such as a display, and/or an audio speaker. The digital image processing device can show graphical user interfaces on the display to assist the user of the metrology system 2.

In some implementations, the digital image processing device can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the digital image processing device is configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for characterizing a mask for microlithography described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments.

Even though the invention has been described on the basis of specific embodiments, numerous variations and alternative embodiments will be apparent to the person skilled in the art, for example through combination and/or exchange of features of individual embodiments. Accordingly, it goes without saying for the person skilled in the art that such variations and alternative embodiments are also encompassed by the present invention, and the scope of the invention is restricted only within the meaning of the appended patent claims and the equivalents thereof.

What is claimed is:

1. A method for detecting an object structure, comprising the following steps:
    illuminating at least one portion of an object with illumination light of an at least partly coherent light source from at least one preferred illumination direction,
    recording at least one diffraction image of the illuminated portion by spatially resolved detection of the diffraction intensity of the illumination light, diffracted by the illuminated portion, in a detection plane, and
    reconstructing at least one portion of the object structure from the at least one recorded diffraction image by way of an iterative method in which, starting from an iteration start value, an iteration diffraction image of a raw object structure is calculated and the latter is compared to the recorded diffraction image in each iteration step,
    wherein the iteration start value is taken by starting from a raw object structure of the object structure to be detected, which is obtained by an iteration start value ascertainment method that is independent of the remaining detection method;
    wherein the iteration start value is obtained by a simulation method; and
    wherein the iteration start value is selected to accelerate a convergence of the iterative reconstruction.

2. The method of claim 1, wherein the simulation of object imaging is used when carrying out the simulation method.

3. The method of claim 1, wherein the iteration start value is obtained proceeding from a measuring method.

4. The method of claim 1, wherein a simulation of an object production is included in the simulation method.

5. The method of claim 1, wherein the simulation of the object comprises an aerial simulation of the object.

6. The method of claim 1, wherein the object is a lithography mask, and the iteration start value is obtained by the simulation of the lithography mask.

7. The method of claim 1, wherein the object is a lithography mask, knowledge about production of the lithography mask is included in the simulation method, wherein empirical judgement that certain edges of object structures are not sharp but rounded in practice is included in the simulation method.

8. The method of claim 2, wherein the object-imaging imaging parameters are used during the simulation, said object-imaging imaging parameters corresponding to those used during illumination and/or reconstruction.

9. The method of claim 4, wherein the object is a lithography mask, and the iteration start value is obtained by the simulation of the production of the lithography mask.

10. The method of claim 5, wherein the aerial simulation is performed based on a design of the object.

11. The method of claim 5, wherein the iteration start value is produced with aid of a start measurement which measurement result is processed to match imaging parameters of the start measurement to imaging parameters of the diffractive imaging recording, and the processed measurement result is used as an input for the aerial simulation of the object.

12. The method of claim 9, wherein the simulation of the production of the lithography mask comprises a simulation of at least one of (i) a structure-influencing etching, or (ii) a development process for specifying object edge rounding.

13. The method of claim 11, wherein at least one of (i) the start measurement is performed without recording a diffraction image, (ii) the start measurement is performed without a sectional object illumination, or (iii) the start measurement is performed without a reconstruction step of the detection method.

14. An apparatus configured to detect a structure of a lithography mask, the apparatus comprising:
an at least partly coherent light source for providing illumination light, a spatially resolving detector, arranged in a detection plane, for detecting a diffraction intensity when recording a diffraction image, and
a mask holder which is displaceable for changing between portions to be illuminated of a lithography mask;
wherein the apparatus is configured to:
illuminate at least one portion of the lithography mask with the illumination light from at least one preferred illumination direction;
record at least one diffraction image of the illuminated portion by spatially resolved detection of the diffraction intensity of the illumination light, diffracted by the illuminated portion, in the detection plane; and
reconstruct at least one portion of the lithography mask from the at least one recorded diffraction image by way of an iterative method in which, starting from an iteration start value, an iteration diffraction image of a raw structure of the lithography mask is calculated and the calculated diffraction image of the raw structure of the lithography mask is compared to the recorded diffraction image of the at least one portion of the lithography mask in each iteration step;
wherein the iteration start value is taken by starting from a raw structure of the lithography mask to be detected, which is obtained by an iteration start value ascertainment method that is independent of the remaining steps of reconstructing the at least one portion of the lithography mask;
wherein the iteration start value is obtained by a simulation of the object; and
wherein the iteration start value is selected to accelerate a convergence of the iterative reconstruction.

15. The apparatus of claim 14, wherein the simulation of object imaging is used when carrying out the simulation method.

16. The apparatus of claim 14, wherein the iteration start value is obtained proceeding from a measuring method.

17. The apparatus of claim 14, wherein a simulation of an object production is included in the simulation method.

18. The apparatus of claim 15, wherein the object-imaging imaging parameters are used during the simulation, said object-imaging imaging parameters corresponding to those used during illumination and/or reconstruction.

19. A method for detecting an object structure, the method comprising:
illuminating at least one portion of an object with illumination light of an at least partly coherent light source from at least one preferred illumination direction;
recording at least one diffraction image of the illuminated portion by spatially resolved detection of the diffraction intensity of the illumination light, diffracted by the illuminated portion, in a detection plane; and
reconstructing at least one portion of the object structure from the at least one recorded diffraction image by way of an iterative method in which, starting from an iteration start value, an iteration diffraction image of a raw object structure is calculated and the latter is compared to the recorded diffraction image in each iteration step;
wherein the iteration start value is obtained with aid of a start measurement of a raw object structure of the object structure to be detected, in which the start measurement is independent of the remaining detection method, and a measurement result of the start measurement is processed to match imaging parameters of the start measurement to imaging parameters of the diffractive imaging recording;
wherein the start measurement is performed without recording a diffraction image; and
wherein the start measurement is generated with at least one of (i) an optical method that is independent of the remaining detection method, (ii) aid of electron microscopy, or (iii) aid of atomic force microscopy.

20. The method of claim 19, wherein the result of the start measurement is used as an input for an aerial simulation of the object, and a result of the aerial simulation is used as the iteration start value.

21. The method of claim 19, wherein at least one of (i) the start measurement is performed without a sectional object illumination, or (ii) the start measurement is performed without a reconstruction step of the detection method.

22. The method of claim 19, comprising using the start measurement as an input variable for a neural network that is trained to map start measurements to results of the diffraction image recording, and an output of the neural network is compared to the recorded diffraction image for at least one iteration step.

23. The method of claim 20, wherein the object is a lithography mask, and the result of the start measurement of the raw object structure of the lithography mask is used as the input for the aerial simulation of the lithography mask, and the result of the aerial simulation of the lithography mask is used as the iteration start value.

* * * * *